(12) United States Patent
Heikkinen et al.

(10) Patent No.: US 10,257,925 B2
(45) Date of Patent: Apr. 9, 2019

(54) METHOD FOR MANUFACTURING AN ELECTRONIC ASSEMBLY

(71) Applicant: TactoTek Oy, Oulunsalo (FI)

(72) Inventors: Mikko Heikkinen, Oulunsalo (FI);
Jarmo Sääski, Oulunsalo (FI)

(73) Assignee: TACTOTEK OY, Oulunsalo (FI)

(*) Notice: Subject to any disclaimer, the term of this patent is extended or adjusted under 35 U.S.C. 154(b) by 0 days.

(21) Appl. No.: 15/483,202

(22) Filed: Apr. 10, 2017

(65) Prior Publication Data
US 2018/0295711 A1 Oct. 11, 2018

(51) Int. Cl.
*H05K 3/40* (2006.01)
*H05K 1/02* (2006.01)
(Continued)

(52) U.S. Cl.
CPC ............ *H05K 1/028* (2013.01); *H05K 1/112* (2013.01); *H05K 3/1216* (2013.01); *H05K 3/28* (2013.01);
(Continued)

(58) Field of Classification Search
CPC ......... H01L 23/28; H01L 23/31; H01L 23/32; H05K 1/028; H05K 1/112; H05K 3/1216;
(Continued)

(56) References Cited

U.S. PATENT DOCUMENTS 6,909,054 B2 * 6/2005 Sakamoto .......... H01L 21/4846
174/260
7,045,899 B2 * 5/2006 Yamane ............. H01L 23/3114
257/688

(Continued)

FOREIGN PATENT DOCUMENTS

DE 10248392 A1 * 5/2004
DE 10248392 A1 5/2004
(Continued)

OTHER PUBLICATIONS

Notification of Transmittal of the International Search Report and The Written Opinion of the International Searching Authority, or the Declaration issued by the International Searching Authority in relation to International Application No. PCT/FI2018/050250 dated Jul. 27, 2018 (10 pages).

*Primary Examiner* — Carl Arbes
(74) *Attorney, Agent, or Firm* — Robert P. Michal, Esq.; Carter, DeLuca, Farrell & Schmidt, LLP

(57) ABSTRACT

A method for manufacturing an electronic assembly and electronic assemblies are presented. The method includes obtaining a substrate film for accommodating electronics, providing at least an electrical contact pad to the substrate film, coupling an electrically conductive member to the electrical contact pad, and molding, such as injection molding, a material layer onto the substrate film to embed the elastic electrically conductive member utilizing a mold structure defining a cavity for molding. The elastic electrically conductive member is arranged to extend during the molding from the electrical contact pad through the cavity to be in contact with an element on a different side of the cavity with respect to the electrical contact pad for maintaining at least a part of the elastic electrically conductive member accessible after the molding to provide an electrical connection through the material layer to the electrical contact pad.

20 Claims, 6 Drawing Sheets

(51) Int. Cl.
  *H05K 1/11* (2006.01)
  *H05K 3/28* (2006.01)
  *H05K 3/12* (2006.01)
(52) U.S. Cl.
  CPC ... *H05K 3/4007* (2013.01); *H05K 2201/0129* (2013.01)
(58) Field of Classification Search
  CPC . H05K 3/28; H05K 3/4007; H05K 2201/0129
  See application file for complete search history.

(56) References Cited

U.S. PATENT DOCUMENTS

| | | | | |
|---|---|---|---|---|
| 7,342,803 | B2* | 3/2008 | Inagaki | H01L 21/4857 257/E23.062 |
| 8,343,810 | B2* | 1/2013 | Oh | H05K 1/186 257/E23.136 |
| 8,916,481 | B2* | 12/2014 | Gan | H01L 25/105 438/127 |
| 2001/0038151 | A1* | 11/2001 | Takahashi | H01L 23/3107 257/778 |
| 2017/0094776 | A1 | 3/2017 | Heikkinen et al. | |

FOREIGN PATENT DOCUMENTS

| | | | |
|---|---|---|---|
| DE | 102013114276 A1 * | 6/2015 | |
| DE | 102013114276 A1 | 6/2015 | |

* cited by examiner

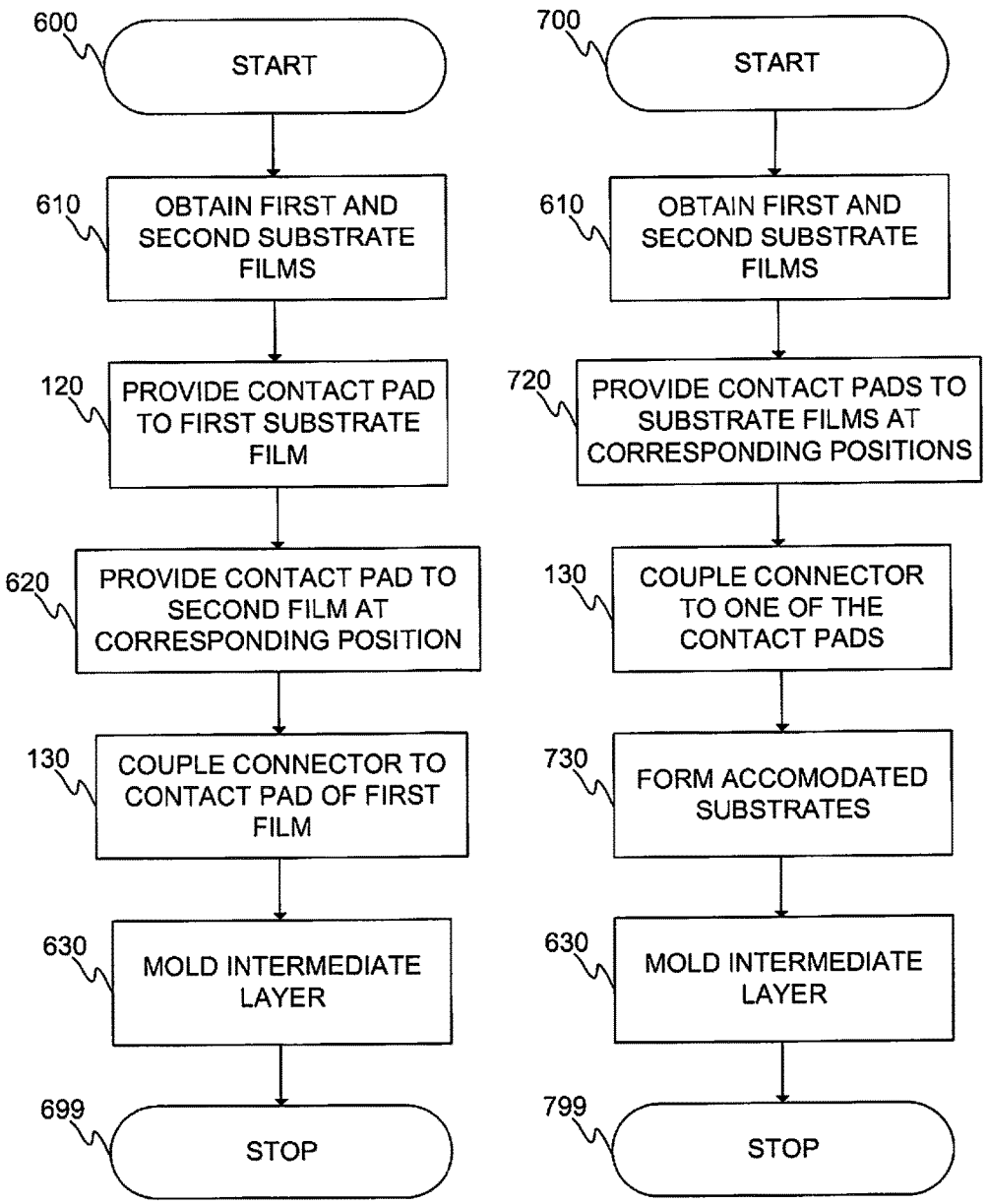
FIG. 6  FIG. 7

METHOD FOR MANUFACTURING AN ELECTRONIC ASSEMBLY

The project leading to this application has received funding from the European Union's Horizon 2020 research and innovation programme under grant agreement No 725076.

TECHNICAL FIELD

The invention concerns in general the technical field of electronics. Especially, however, not exclusively, the invention concerns manufacturing an electronic assembly having a multilayer structure.

BACKGROUND

A variety of different multilayer structures exists in general in the context of electronics and electronic products. Multilayered solutions may be manufactured using thermoforming, molding, adhesives, heat and/or pressure based lamination, etc. In-mold decoration (IMD)/in-mold labeling (IML) may be harnessed to incorporate desired coloring and e.g. graphical patterns within the structure.

The motivation or need striving for multilayer structures may be as diverse as the related use contexts. Often savings in size, weight, cost, or just efficient integration of components is sought for when the determined solution utilizes ultimately multiple layers. In turn, the associated use scenario may relate to product packages or food casings, visual design of device housings, displays, detectors or sensors, vehicle interiors, antennae, labels, etc.

Electronics such as electronic components, integrated circuits (ICs), and conductors may generally be provided into or onto a multilayer structure by a plurality of different techniques. Naturally ready-made electronics such as available surface mount devices (SMD) may be mounted on a substrate that ultimately forms an inner or outer layer of a multilayer structure. Additionally, technologies falling under the term "printed electronics" may be applied to actually produce electronics directly to the associated substrate. The term "printed" refers in this case to various printing techniques capable of producing electronics/electrical elements, including, however, not limited to, screen printing, flexography, and inkjet printing.

In attempted solutions, the electronic components have been arranged on a substrate after which the components are typically overmolded by thermoplastic material. The outer surface comprising buttons, and functioning typically as a user interface, for example, is typically the same substrate as the one comprising the electronic components. In some cases, however, it is beneficial to have some components of the electrical circuit elsewhere with respect to the substrate providing the outer surface. In some cases it may be beneficial to provide electrical power through the molded layer in order to further facilitate to use the multilayered electronic assembly. In attempted solutions, the electrical connection through the molded material is established after the molding which typically requires mechanical work, such as carving, to be carried out. There is still a need for providing a method for manufacturing an electronic assembly in which the electrical connection is provided through the molded material layer and which does not require post-processing for establishing the electrical connection.

SUMMARY

The objective of the present invention is to at least alleviate the above-described problems associated with electronic assemblies having multilayer structure, such as, at least one layer accommodating electronics and one molded material layer.

The objective is achieved with embodiments of the electronic assembly and the related method of manufacture in accordance with embodiments of the present invention.

According to a first aspect, a method for manufacturing an electronic assembly is provided. The method comprises obtaining a, preferably flexible, first substrate film for accommodating electronics, providing, optionally through utilizing printed electronics technology such as screen printing, at least a first electrical contact pad to the first substrate film, coupling an electrically conductive member, such as an electrical connector, to the first electrical contact pad, and molding, such as injection molding, a second material layer onto the first substrate film to embed the electrically conductive member, such as the electrical connector, utilizing a mold structure defining a cavity for molding, wherein the electrically conductive member is arranged to extend during the molding from the first electrical contact pad through the cavity to be in contact, such as in mechanical, electrical or chemical, or in a combination of these, such as in electromechanical contact, with an element, such as a part of the mold structure, e.g. a cavity plate, or a film or a spacer or a conductor, on a different, preferably the opposite, side of the cavity with respect to the first electrical contact pad for maintaining at least a part of the electrically conductive member accessible after the molding to provide an electrical connection through the second material layer to the first electrical contact pad.

The first substrate film may, preferably, be flexible, however, it may also be rigid, or formable or flexible at certain temperatures, that is, depending on the temperature of the substrate.

The "electrical contact pad" refers herein to any electrically conductive element or a patch, or a point or area of electrical coupling on the substrate film which may be used for establishing an electrical connection between the electrically conductive member and, for example, an electrical circuit in electrical connection with the electrical contact pad arranged on the same substrate as said pad. The electrical contact pad may be made of conductive material, such as copper, silver, aluminum, or of conductive elastomer, such as comprising carbon or other conductive particles, or other such materials which may enhance the visual quality of the surface on or within which the pad resides. The shape of the electrical contact pad may be any suitable geometric shape. The shape of the pad may advantageously be chosen based on the shape or characteristics of the product or part of the product intended to be manufactured comprising said electrical contact pad.

The "mold structure" refers herein to a structure defining a cavity into which molding material, for example thermoplastic material, may be arranged or injected. The "mold structure" may comprise, for example, parts such as cavity plates, which are typically manufactured of metal such as steel, for example mild steel, or aluminum, and, optionally, ejector(s). In addition to said parts, the "mold structure" as defined herein may comprise an element or elements arranged into the cavity such as separate or fixed core parts. The element or elements may be core extensions, films, spacers and/or conductors arranged, for example, onto the opposite side of the cavity with respect to the first substrate film. The element or elements may thus affect the shape of the cavity and, therefore, the shape of the manufactured object comprising the molded part. The element or elements may be separated after the molding or may become part of the electronic assembly during molding.

The obtaining may further comprise obtaining a, preferably flexible, second film, wherein the second material layer is molded at least between the first substrate film and the second film to embed the electrically conductive member. The electrically conductive member may extend from the first electrical contact pad to be in contact, such as in mechanical, electrical or chemical, or combination of these, such as in electromechanical contact, with the second film. At least one of the first substrate film and the second film may be flexible.

The obtained second film may also be for accommodating electronics, such as a, preferably flexible, second substrate film, and the providing may further comprise providing, optionally through utilizing printed electronics technology such as screen printing, at least a second electrical contact pad to the second substrate film to a corresponding position with respect to the first electrical contact pad, and the molding may comprise the electrically conductive member to extend from the first electrical contact pad to be in contact, such as in mechanical, electrical or chemical, or combination of these, such as in electromechanical contact, with the second electrical contact pad for providing an electrical connection from the first electrical contact pad through the second material layer to the second electrical contact pad.

The second substrate film may, preferably, be flexible, however, it may also be rigid, or formable or flexible at certain temperatures, that is, depending on the temperature of the substrate.

The second electrical contact pad may be arranged in the corresponding position so that the first and second electrical contact pads align opposite to each other when the first and second substrates films may be inserted or arranged into the mold for the molding of the second material layer at least between said films.

The providing may further comprise providing one or several electronics components onto at least one of the first and second substrate films, wherein said components, said electrical contact pads and the electrically conductive member form an electrical circuit residing on both of the first and second substrate films.

The electrically conductive member may be an elastic electrically conductive member, such as an electrically conductive spring connector.

The elastic electrically conductive member may be arranged to compress against the element for maintaining at least the part of the elastic electrically conductive member accessible after the molding to provide the electrical connection through the second material layer to the first electrical contact pad.

The elastic electrically conductive member may be an enclosed elastic electrically conductive member for substantially sustaining its elasticity during the molding.

The method may comprise forming, such as thermoforming or cold forming, e.g., by press forming or using vacuum or overpressure, at least one of the first substrate film, the second substrate film and the second film to a desired three-dimensional shape, advantageously, corresponding to the shape defined by the cavity of the mold structure.

According to a second aspect, an electronic apparatus comprising an electronic assembly manufactured utilizing the method in accordance with the first aspect is provided.

According to a third aspect, an electronic assembly is provided. The electronic assembly comprises:

a, preferably at least originally flexible, first substrate film comprising electronics, wherein said electronics comprises at least electrically conductive material, such as a screen printed conductor or patch, defining a first electrical contact pad, a second material layer comprising molded material, such as injection molded thermoplastic material, and an electrically conductive member, such as an electrical connector, coupled to the first electrical contact pad and extending from the first electrical contact pad through the second material layer, wherein a part of the electrically conductive member is accessible for providing electrical connection through the second layer to electrical contact pad, wherein the electrically conductive member, such as the electrical conductor, is embedded, substantially completely, however, not including said part accessible for providing electrical connection, in the second material layer.

The electronic assembly may comprise a second substrate film on opposite side of the second material layer with respect to the first substrate film. The electrically conductive member may extend from the first electrical contact pad through the second material layer to the second substrate film.

The second substrate film may comprise electronics, wherein said electronics comprises at least electrically conductive material defining a second electrical contact pad, and the electrically conductive member being in electrical connection with the first and second electrical contact pads providing an electrical connection between the first and the second electrical contact pads.

The electrically conductive member may be at least originally elastic electrically conductive member, such as an electrically conductive spring connector.

The at least originally elastic electrically conductive member may be an enclosed elastic electrically conductive member being elastic.

Furthermore, the first and second electrical pads may be disposed substantially opposite with respect to each other onto the first and second substrate films, respectively, thus having the at least originally elastic electrically conductive member extending through the molded material layer between said electrical pads.

The utility of the present invention arises from a plurality of issues depending on the embodiment.

Multilayer structures having molded parts may be obtained in which the electrical circuit on the obtained substrate, such as a user interface having buttons and/or sensors, may be fed by electrical power through the molded material layer via the established electrical connection, thus, not requiring a separate connection to said substrate, for example, from the side. Post-processing is not required or at least minimized due to the established connection through the molded material layer by the electrically conductive member.

In embodiments having two films or substrates or sheets, the electrical connection may be established between the films or substrates or sheets substantially simultaneously when producing the molded layer between the films or substrates or sheets, thus, not requiring post-processing in order to establish an electrical connection between said films or substrates or sheets. Therefore, the present invention may be utilized to facilitate the manufacturing of electrical circuits distributed on two separate films or substrates or sheets and having an electrical connection between them.

The terms "first", "second" and "third" do not denote any order, quantity, or importance, but rather are used to distinguish one element from another.

The exemplary embodiments of the invention presented herein are not to be interpreted to pose limitations to the applicability of the appended claims. The verb "to comprise" is used herein as an open limitation that does not exclude the existence of also unrecited features. The features recited in depending claims are mutually freely combinable unless otherwise explicitly stated.

The novel features which are considered as characteristic of the present invention are set forth in particular in the appended claims. The present invention itself, however, both as to its construction and its method of operation, together with additional objectives and advantages thereof, will be best understood from the following description of specific embodiments when read in connection with the accompanying drawings.

BRIEF DESCRIPTION OF FIGURES

The embodiments of the present invention are illustrated by way of example, however not by way of limitation, in the figures of the accompanying drawings, which are briefly described in the following.

FIG. 6 illustrates a flow diagram of a method in accordance with an embodiment of the present invention.

FIG. 7 illustrates a flow diagram of a method in accordance with an embodiment of the present invention.

DESCRIPTION OF SOME EMBODIMENTS

Figure 1:
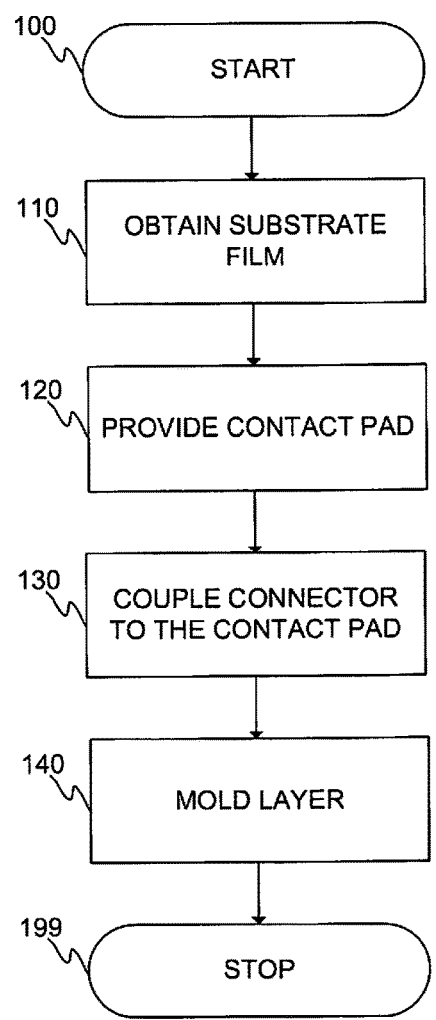
FIG. 1 illustrates a flow diagram of a method in accordance with an embodiment of the present invention.

FIG. 1 illustrates a flow diagram of a method in accordance with an embodiment of the present invention. At 100, referring to a start-up phase, the necessary tasks such as material, components, such as electronics components and connectors, and tools selection, acquisition, calibration and other configuration may take place. Specific care must be taken that the individual elements and material selections work together and survive the selected manufacturing process and possible target product whereto the structure may be disposed, which is naturally preferably checked up-front on the basis of the manufacturing process specifications and component data sheets, or by investigating and testing the produced prototypes, for example. Molding, such as injection molding, IMD/IML, lamination, and/or printing equipment, among others, may be thus ramped up to operational status at this stage.

Optionally, prior to or at step 110, decorations, graphical indications, colors etc. may be produced onto the film by printing, for instance. This optional step may be omitted or position thereof altered in the method flow. Alternatively or additionally, other layers such as a protective layer could be provided with such features. For example, screen printing or inkjet printing may be applied. Decorative or indicative (e.g. instructive) features may be generally provided using IMD/IML compatible methods.

At 110, at least one, preferably flexible, substrate film for accommodating electronics is obtained. Ready-made substrate material, e.g. roll of plastic film, may be acquired and optionally processed such as coated, colored (if not initially of desired color or e.g. optimum degree of transparency or translucency), carved, embossed, shaped, etc., or the substrate itself may be produced "in-house" from scratch by molding or other methods from the desired starting material(s). The at least one substrate film may be obtained as already exhibiting desired three-dimensional shape. The desired shape may have been produced by molding or forming. The obtained already shaped substrate film may also still be formed further.

At 120, at least one electrical contact pad, trace, patch or conductor may be provided to the desired locations on the substrate by printing, for example, and electronic components may be attached by appropriate mounting technique, respectively. Flexible printing circuits (FPC) structure may be thus formed. Mounting may include using adhesive, paste and/or conductive ink for establishing and securing the desired mechanical and electrical connections, for instance. Item 120 may be executed repeatedly or alternately, depending on the embodiment, whereupon their separation into dedicated execution phases is not always necessary or even possible.

Electronic components may refer to electronics, for example, switches or integrated circuits, or conductors, conductive areas, traces, patches, and/or also to mechanical components, such as, support members, insulating elements, etc. utilized in conjunction with such electronic components and/or assemblies, and they may have been arranged on the substrate by mounting using adhesive, paste and/or conductive ink, or by any other means such as by screen printing or other such methods as described herein.

According to various embodiments, the electrical contact pad may be a typical contact pad, comprise several contact pads, be a conductive surface, e.g., of a printed circuit board (PCB), or it may be a block element substantially extending away from the substrate layer rather than being a thin, planar contact pad, or comprise conductive elastomer. The electrical contact pad may comprise one or several conductive layers or elements.

At 130, an electrically conductive member, such as an electrical conductor is coupled to the electrical contact pad provided at step 120 to the substrate film. The electrically conductive member may, advantageously, be coupled in such a way that one end of the member is coupled to the provided electrical contact pad and the member then extends, preferably substantially perpendicularly, away from the substrate film. The electrically conductive member may, however, extend in any position or direction with respect to the substrate film depending on the desired configuration.

According to various embodiments, steps 120 and 130 may be performed substantially simultaneously such as to couple the electrically conductive member to the electrical contact pad simultaneously or even prior to other electronic components which may be arranged on the substrate.

At 140, a preferably plastic layer, e.g. of thermoplastic, thermosetting, elastomeric material, polymer, organic, biomaterial, composite, such as organic or graphic, as well as any combination thereof, is molded over at least the surface of the substrate film from which the electrically conductive member extends from, thus embedding the electrically conductive member by utilizing a mold structure. The mold structure advantageously forms a mold cavity into which the substrate comprising the electrically conductive member may be arranged or inserted. The electrically conductive member extends during the molding from the electrical contact pad to be in contact, such as mechanical, electrical, chemical, or electromechanical contact, with the mold structure or an element inserted into the mold cavity opposite to the substrate film comprising the electrical contact pad. The electrically conductive member thus extends from the electrical contact pad through the mold cavity all the way to the opposite side of the mold cavity and prevents or at least significantly reduces the amount of molded material from embedding the electrically conductive member completely, leaving at least a part of the electrically conductive member accessible in order to provide an electrical connection through the molded material layer to the electrical contact pad comprised in the substrate layer.

At 140, the electrically conductive member may slightly compress against the mold in order to sustain a part of the electrically conductive member accessible after the molding in order to provide an electrical connection through the molded material layer to the electrical contact pad comprised on the substrate. The force exerted by the electrically conductive member advantageously prevents or at least significantly reduces the amount of molding material to cover the electrically conductive member completely thus sustaining a part of the electrically conductive member accessible.

Having regard to potential properties of the substrate film or sheet, the substrate film or sheet may, preferably, be flexible. The substrate film or sheet may comprise e.g. plastics/polymer, such as Poly Carbonate (PC), Poly Methyl Methacrylate (PMMA), polyimide, a copolymer of Methyl Methacrylate and Styrene (MS resin), Polyethylene Terephthalate (PET), or metal. The substrate film or sheet may comprise organic or biomaterials, such as wood, leather or fabric, or a combination of any of these materials with each other or with plastics or polymers or metals. These materials may also be utilized in the molded layer and/or protective layer. The substrate film or sheet may also be further processed, such as shaped, formed, coated, etc.

The substrate film may include relief forms or shapes such as protrusions, ridges, grooves, or recesses relative to the surface plane of the film, optionally through holes. These features may be utilized to accommodate or at least partially embed elements such as conductors, components, etc. within the substrate film. Similar features may be present in the protective layer.

Injection molding may be applied in the manufacturing process. The substrate and optionally the protective layer(s) (if already present) may be used as an insert in the mold structure or mold. Optionally multi-shot or multi-component molding is applied to provide e.g. multiple materials to the multilayer structure. Plastic layer may be at least partially optically transparent and/or comprise recesses or through-holes to provide visual path to the underlying electronics that may include optoelectronic components (light-emitting diodes (LEDs), photosensitive detectors) or e.g. a display such as OLED (organic LED) display. The plastic layer may additionally or alternatively contain opaque, e.g. colored or graphics-containing, or translucent portions. The plastic player may be further provided with surface relief forms or other features for various purposes, such as for optical use (e.g. light incoupling, outcoupling, scattering, or reflection).

According to some embodiments, an additional layer, such as a, preferably flexible, layer or substrate, may be arranged on the opposite side of the molded material layer with respect to the substrate film to which the electrically conductive member is coupled to. The additional layer may be arranged before the molding so that the molded material layer may then be molded between the substrate film and the additional layer or substrate. The additional layer may also be, for example, laminated, such as by using adhesives, onto the molded material layer after the molding.

At 199, the method execution is ended. The electronic assembly manufactured may be taken out of the mold structure once the molded material has been solidified enough.

Figure 2:
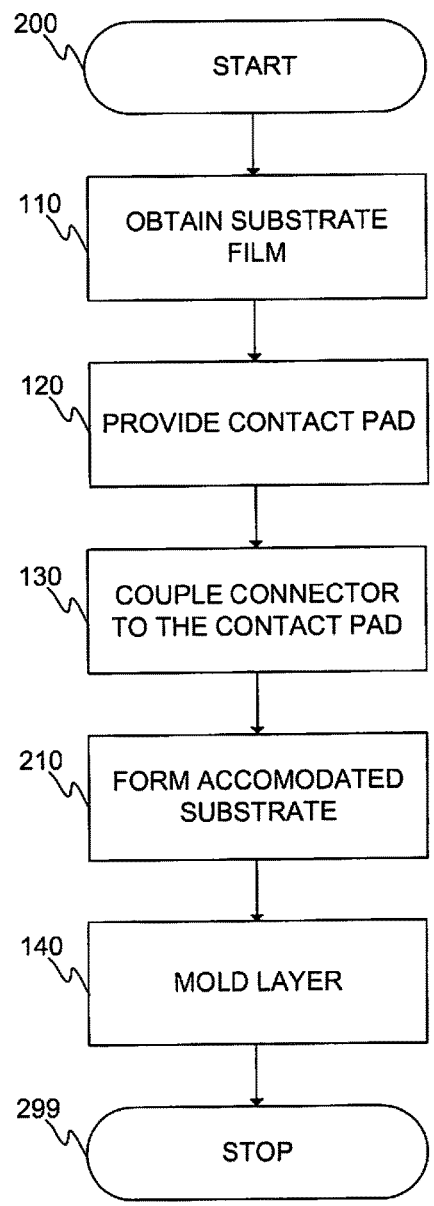
FIG. 2 illustrates a flow diagram of a method in accordance with an embodiment of the present invention.

FIG. 2 illustrates a flow diagram of a method in accordance with an embodiment of the present invention. At 200, referring to a start-up phase, the necessary tasks such as material, components, such as electronics components and connectors, and tools selection, acquisition, calibration and other configuration may take place. Specific care must be taken that the individual elements and material selections work together and survive the selected manufacturing process and possible target product whereto the structure may be disposed, which is naturally preferably checked up-front on the basis of the manufacturing process specifications and component data sheets, or by investigating and testing the produced prototypes, for example. Molding, such as injection molding, IMD/IML, lamination, forming, such as thermoforming, and/or printing equipment, among others, may be thus ramped up to operational status at this stage.

Steps 110, 120, 130 illustrated in FIG. 2 are substantially similar to what is described above with respect to FIG. 1. According to various embodiments, steps 120 and 130 may be performed substantially simultaneously such as to couple the electrically conductive member to the electrical contact pad substantially simultaneously or even prior to the electronic components.

At 210, forming, such as thermoforming or cold forming, e.g., by press forming or using under/overpressure, takes place. During the forming, the, preferably flexible, substrate film, preferably already provided with electronics, may be shaped to a desired substantially three-dimensional shape utilizing the mold structure. The electronics shall have been disposed preferably so as to avoid locations of greatest stress occurring during forming, such as the locations of greatest pressure or curvature.

According to some embodiments, step 210 may also be performed prior to steps 120 and/or 130 although described hereinbefore after the steps 120 and 130.

Step 140 is substantially similar to what is described above with respect to FIG. 1.

According to some embodiments, an additional layer, such as a flexible layer or substrate, may be arranged on the opposite side of the molded material layer with respect to the substrate film to which the electrically conductive member has been coupled to. The additional layer may be arranged before the molding so that the molded material layer may then be molded between the substrate film and the additional layer or substrate. The additional layer may also be laminated, such as by using adhesives, onto the molded material layer after the molding. The additional layer may be decorative and/or may be, for example, a surface for capacitive switch. If functioning as such surface for capacitive switch, the electrically conductive member or members are advantageously residing at a short distance from the additional layer thus providing a high performance capacitive switch.

At 299, the method execution is ended. The three-dimensional electronic assembly manufactured may be taken out of the mold structure, such as out of the cavity for molding, once the molded material has been solidified enough.

Figure 3:
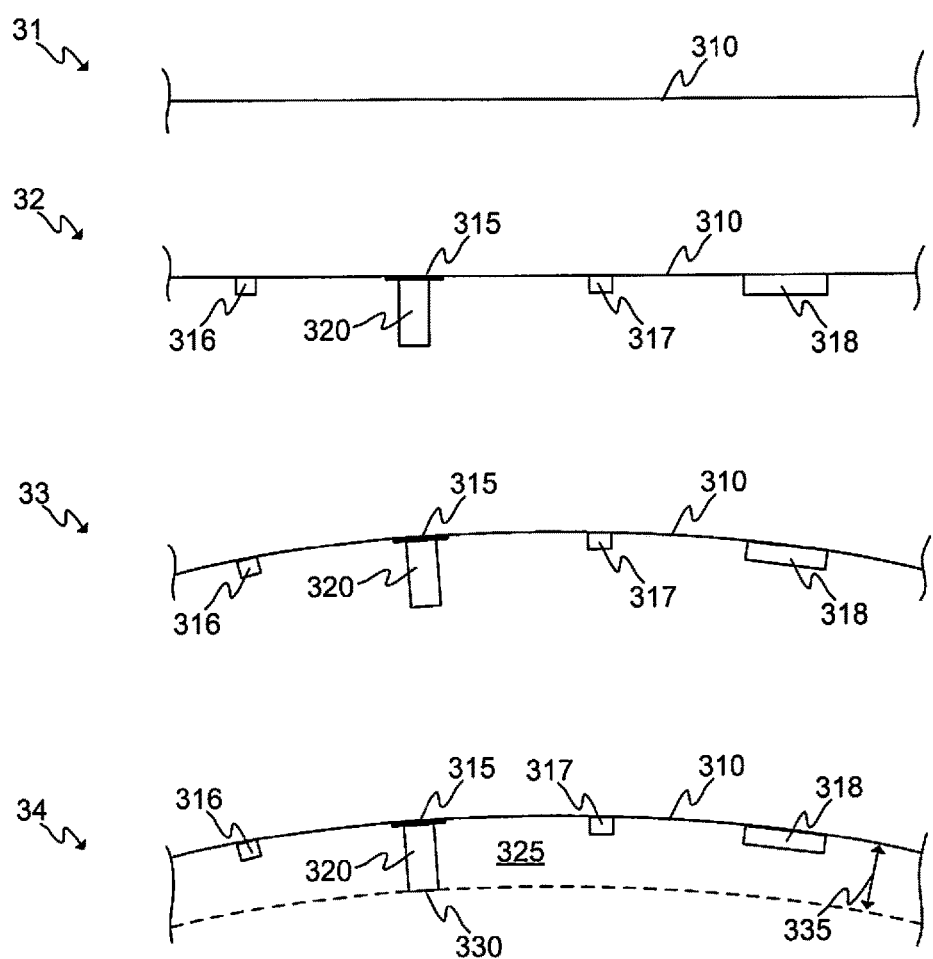
FIG. 3 illustrates an electronic assembly according to an embodiment of the present invention.

FIG. 3 illustrates schematically an electronic assembly during various phases of manufacturing according to an embodiment of the present invention. The shown dimensions in FIG. 3 are exemplary, but in many embodiments the substrate film 310 may be substantially thinner than the molded layer 325. At 31, the substrate film 310, preferably a flexible substrate film, is obtained. There may be decorations, graphical indications, colors etc. produced onto the film by printing, for instance. Alternatively or additionally, other layers such as the protective layer could be provided with such features. For example, screen printing or inkjet printing may be applied. Decorative or indicative (e.g. instructive) features may be generally provided using IMD/IML compatible methods.

At 32, an electrically conductive member 320, such as an electrically conductive spring connector 320, is coupled to the electrical contact pad 315 provided to the substrate film 310 beforehand. The electrically conductive member 320 may, advantageously, be coupled in such a way that one end of the member 320 is coupled to the provided electrical contact pad 315 and the member 320 then extends substantially perpendicularly from the substrate film 310. The electrically conductive member 320 may, however, extend in any position or direction with respect to the substrate film 310, mainly depending on the desired configuration, the electrically conductive member 320 and/or the electrical contact pad 315, which may be such that the member 320, after being coupled to the pad 315, extends a direction significantly deviating from the perpendicular direction, for example, up to 45 or 60 degrees.

At 32, other electronics, such electronic components, may also be provided on one or several surfaces of the substrate film. The other electronics comprise at least an electronic contact pad 315, but may also comprise electronic components 316-318 such as passive components, conductors, LEDs, or ICs by feasible manufacturing or mounting technology. Mounting techniques may include surface mounting and through-hole mounting, for instance. Manufacturing such as printing may refer to screen printing or inkjet printing among various other options.

At 33, the substrate film, preferably elastic substrate film, provided with at least with the electrically conductive member 320 is formed such as by thermoforming or cold forming. During forming, the substrate film, preferably already provided with electronics, may be shaped to a desired substantially three-dimensional shape. The electrically conductive member 320 and the electronics 316-318 shall have been disposed preferably so as to avoid locations of greatest stress occurring during forming, such as the locations of greatest pressure or curvature.

At 34, a material layer, preferably a plastic material layer, e.g. of thermoplastic, thermosetting, elastomeric material, polymer, organic, biomaterial, composite, such as organic or graphic, as well as any combination thereof, is molded over at least the surface of the substrate film from which the electrically conductive member 320 extends from, thus embedding the electrically conductive member 320. Injection molding may be applied. The substrate and optionally the protective layer(s) (if already present) may be used as an insert in the mold. Optionally, multi-shot or multi-component molding is applied to provide e.g. multiple materials to the multilayer structure. Plastic layer may be at least partially optically transparent and/or comprise recesses or through-holes to provide visual path to the underlying electronics that may include optoelectronic components (LEDs, photosensitive detectors) or e.g. a display such as OLED (organic LED) display. The plastic layer may additionally or alternatively contain opaque, e.g. colored or graphics-containing, or translucent portions. It may be further provided with surface relief forms or other features for various purposes, such as for optical use (e.g. light incoupling, outcoupling, scattering, or reflection).

According to an embodiment of the present invention, the electrical connection may also be established by forming, such as bending or folding, a substrate film to be essentially U-shaped and comprise an electrically conductive member 320 to extend through the molded material layer 325. The first electrical pad 315 may be arranged in this case on to a first surface of the substrate 310, and the electrically conductive member 320 may then extend through the molded material layer to be in contact with the first surface of the substrate 310 on the opposite side of the molded material layer 325. The electrically conductive member 320 may also extend along the first surface on the bent or folded part of the substrate 310.

In various embodiments, the multilayered electronic assembly may actually comprise a plurality of flexible films, molded layers and/or protective layers, which may be mutually similar or different in terms of their configuration (e.g. dimensions, shape, orientation, materials, etc.), but for simplicity, the shown example in FIG. 3 comprises only the substrate film 310 and the molded material layer 325. Also further layers, e.g. a decorative layer or indicative graphics-containing layer establishing e.g. symbols, pictures, or alphanumeric information may have been arranged to the structure. IMD or IML techniques are thus applicable.

The obtained multilayered electronic assembly may optionally contain mutually different multilayer portions having regard to the number of overlapping layers. At some location, there may be a greater number of stacked layers (i.e. additional layer(s)) than in other location. Generally the layers may be superposed but different in terms of unity (some layer(s) may be built up from e.g. a plurality of distributed elements substantially on the same lateral plane), width, and/or height. All the layers do not have to reside mutually superposed but may be located differently along the height of the multilayer stack. Naturally the successive layers have to contact each other at least in places. The layers may contain through-holes or windows.

Figure 4A:
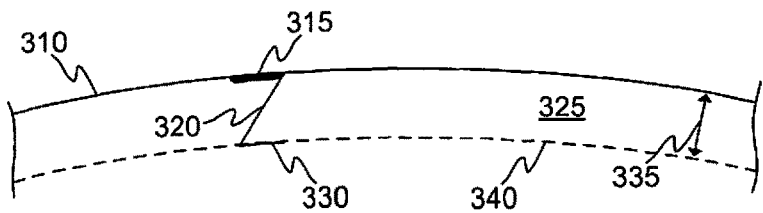
FIGS. 4A-4D illustrate schematically electronic assemblies according to a few embodiments of present invention.
Figure 4B:
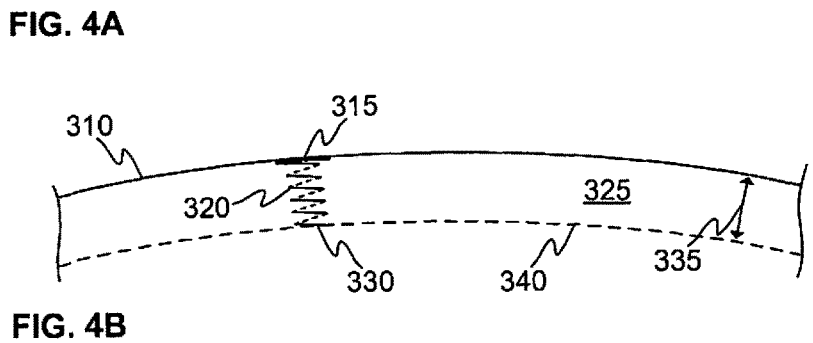
Figure 4C:
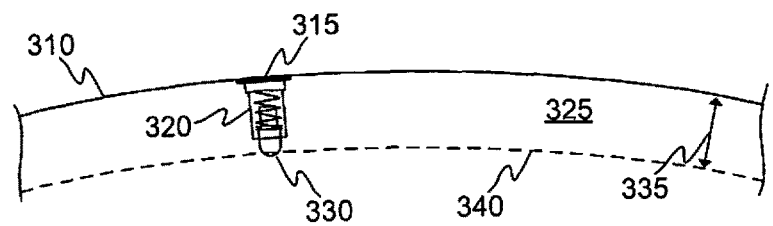

FIGS. 4A-4D illustrate schematically electronic assemblies according to plurality of embodiments of the present invention. Particularly, FIGS. 4A-4C illustrate alternatives for the elastic electrically conductive member 320, such as different types of elastic electrically conductive members, for example, spring or spring loaded connectors 320. At least a part 330 of the elastic electrically conductive member 320 is accessible providing an electrical connection through the molded material layer 325 to the electrical contact pad 315. The local thickness 335 of the molded material 325, i.e., the distance locally from the substrate film 310 to the edge 340 of the molded material layer 325 may be constant or may vary depending on the position. The elastic electrically conductive member 320 extends from the electrical contact pad 315 advantageously at least locally through the molded material layer 325 providing an electrical connection through the molded material at that particular position.

According to some embodiments of the present invention, the electrically conductive member 320 as described in connection with FIGS. 1-3 may be an elastic electrically conductive member, such as any of the members illustrated in FIGS. 4A-5 and described in the text concerning FIGS. 4A-5.

According to the embodiments illustrated in FIGS. 4A-4C, the originally elastic electrically conductive member 320 may be rigidified by the molded material after molding. According to some embodiments, an additional layer, such as a flexible layer or substrate, may be placed on the opposite side of the molded material layer 325 with respect to the substrate film 310, i.e., the additional layer may be arranged before the molding so that the molded material layer 325 may then be molded between the substrate film and the additional layer or substrate. The additional layer may also be arranged on the edge of the molded material 340 such as by laminating, for example by using adhesives after the molding. The additional layer may include a marker for indicating the position of the elastic electrically conductive member 320 beneath the additional layer in order to be easily accessible for providing an electrical connection through the molded material 325 to the electrical contact pad 315.

Figure 4D:
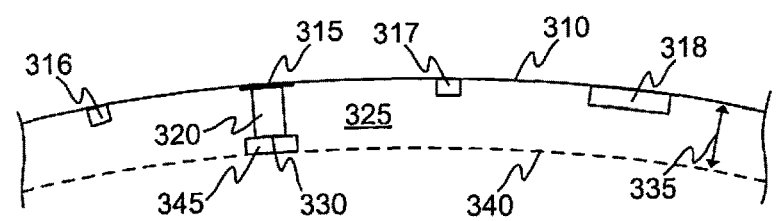

FIG. 4D illustrates schematically an embodiment according to which there may be an element 345, in this case other than a layer or sheet, for example, a spacer or a conductor, arranged into the cavity defined by the mold structure before the molding, and the elastic electrically conductive member 320 arranged to extend between the electrical contact pad 315 of the substrate film and the element 345. The element 345 may be removed after the molding, thus, exposing the part 330 of the elastic electrically conductive member 320 to provide an electrical connection through the molded material layer 325. The element 345 may become part of the electronic assembly, for example, if the element 345 is electrically conductive in which case the accessible part 330 may be the end of the element 330 substantially aligned with the edge 340 of the molded material layer 325.

According to an embodiment of the present invention, there may be conductive elastic material, such as a piece of conductive elastomer, coupled to the first electrical contact pad. An electrically conductive spring connector, for example, may then be coupled on to the conductive elastic material to extend through the molded material layer for providing an electrical connection through the molded material layer. In this case the elastic electrically conductive member 320 comprises a combination of electrically conductive elements. As also previously described herein, the combination of elements may include rigid elements as long as there is at least one elastic element to provide elasticity to the elastic electrically conductive member 320 as a whole.

Figure 5:
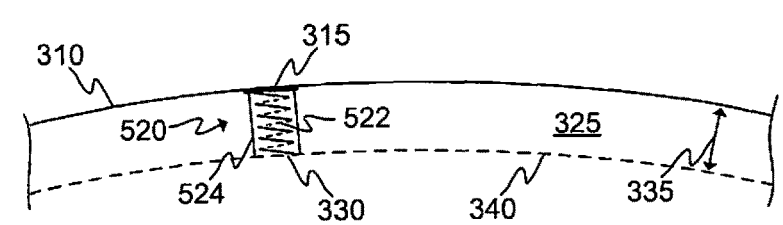
FIG. 5 illustrates an electronic assembly according to an embodiment of present invention.

FIG. 5 illustrates an electronic assembly according to an embodiment of present invention. The elastic electrically conductive member in FIG. 5 is an enclosed elastic electrically conductive member 520 comprising a spring member 522 and a housing 524 or an enclosure 524. The enclosed elastic electrically conductive member 520 extends from the electrical contact pad 315 advantageously at least locally through the molded material layer 325 providing an electrical connection through the molded material at that particular position. Because the spring member 522 is enclosed within the housing 524, the molded material layer 325 does not, advantageously, rigidify the spring member 522 and, therefore, the enclosed elastic electrically conductive member 520 maintains its elasticity during the molding. After the molding, at least a part 330 of the enclosed elastic electrically conductive member 520 is accessible providing an electrical connection through the molded material layer 325 to the electrical contact pad 315. The local thickness 335 of the molded material 325, i.e., the distance locally from the substrate film 310 to the edge 340 of the molded may be constant or may vary. According to an embodiment, the body or enclosure 524 of the enclosed elastic electrically conductive member 520 may also be elastic, such as flexible plastic or rubber, or rigid, such as metal.

According to an embodiment, the spring member 522 of the enclosed elastic electrically conductive member 520 may be accessible after the molding, either directly or from beneath an additional film, i.e., through the additional film, so that the spring member 522 may be used to provide an electrical connection through the molded material layer 325. The resting position of the spring member 522 may be such that the member extends from the electrical contact pad of the first substrate film, at least locally, farther than the edge 340 of the molded material 325.

According to various embodiments, the additional layer may be utilized on the molded material layer 325. The additional layer may also be arranged on the edge of the molded material 340 such as by laminating, for example by using adhesives. The additional layer may include a marker for indicating the position of the elastic electrically conductive member 320 beneath the additional layer.

In connection with FIGS. 4A-5, the elasticity of the elastic electrically conductive member may also be advantageous by decreasing the requirement for strict tolerances in the molding process because said member may be compressed with respect to its resting position thus allowing higher tolerances in the process compared to use of rigid connectors.

FIG. 6 illustrates a flow diagram of a method in accordance with an embodiment of the present invention. At 600, referring to a start-up phase, the necessary tasks such as material, components, such as electronics components and connectors, and tools selection, acquisition, calibration and other configuration may take place. Specific care must be taken that the individual elements and material selections work together and survive the selected manufacturing process and possible target product whereto the structure may be disposed, which is naturally preferably checked up-front on the basis of the manufacturing process specifications and component data sheets, or by investigating and testing the produced prototypes, for example. Molding, such as injection molding, IMD/IML, lamination, and/or printing equipment, among others, may be thus ramped up to operational status at this stage.

At 610, at least two, preferably flexible, substrate films for accommodating electronics are obtained, namely first and second substrate films. Ready-made substrate material, e.g. roll of plastic film, may be acquired and optionally processed such as coated, colored (if not initially of desired color or e.g. optimum degree of transparency or translucency), carved, embossed, shaped, etc., or the substrate itself may be in-house produced from scratch by molding or other methods from the desired starting material(s).

Step 120 is substantially similar to what is described above with respect to FIG. 1. At 120 in connection with the embodiment illustrated in FIG. 6, the electrical contact pad is provided to the first substrate film.

At 620, an electrical contact pad is provided to the second substrate film to a corresponding position with respect to the electrical contact pad of the first substrate film. The corresponding position refers herein to a position which is, for example, aligned so that when the substrate films are arranged for molding, the, optionally elastic, electrically conductive member 320 (provided in step 130) extends from the electrical contact pad of the first substrate film to be in contact with the electrical contact pad of the second substrate film thus providing an electrical connection between the electrical contact pads on the first and second substrate films.

Step 130 is substantially similar to what is described above with respect to FIG. 1.

At 630, a preferably plastic layer, e.g. of thermoplastic, thermosetting, elastomeric material, polymer, organic, biomaterial, composite, such as organic or graphic, as well as any combination thereof, is molded between the first and second substrate layers between which the, optionally elastic, electrically conductive member extends, thus embedding the, optionally elastic, electrically conductive member by utilizing a mold structure. The mold structure advantageously forms a cavity for molding into which the substrates may be inserted. The, optionally elastic, electrically conductive member, preferably, extends during the molding from the electrical contact pad of the first substrate film to be in contact with the electrical contact pad of the second substrate film, i.e. extending from between the electrical contact pads. The, optionally elastic, electrically conductive member, advantageously, extending during the molding from the electrical contact pad of the first substrate layer to be in contact with the second substrate layer and prevents or at least significantly reduces the amount of molded material from embedding the, optionally elastic, electrically conductive member completely, leaving at least a part of the, optionally elastic, electrically conductive member in contact with the electrical contact pad of the second substrate layer providing an electrical connection through the molded material layer between the electrical contact pads of the first and second substrate layers.

At 630, the, optionally elastic, electrically conductive member may compress against the electrical contact pad of the second substrate layer during the molding in order to provide an electrical connection through the second material layer between the electrical contact pads of the first and second substrate layers after the molding. The force exerted by the, optionally elastic, electrically conductive member advantageously prevents to cover the, optionally elastic, electrically conductive member completely thus sustaining a part of the, optionally elastic, electrically conductive member accessible. The elasticity of the elastic electrically conductive member may also be advantageous to decrease the requirement for strict tolerances in the molding process because said member may be compressed with respect to its resting position thus allowing higher tolerances in the process.

At 699, the method execution is ended. The electronic assembly manufactured may be taken out of the mold once the molded material has been solidified enough.

FIG. 7 illustrates a flow diagram of a method in accordance with an embodiment of the present invention. At 700, referring to a start-up phase, the necessary tasks such as material, components, such as electronics components and connectors, and tools selection, acquisition, calibration and other configuration may take place. Specific care must be taken that the individual elements and material selections work together and survive the selected manufacturing process and possible target product whereto the structure may be disposed, which is naturally preferably checked up-front on the basis of the manufacturing process specifications and component data sheets, or by investigating and testing the produced prototypes, for example. Molding, such as injection molding, IMD/IML, forming, such as thermoforming, lamination, and/or printing equipment, among others, may be thus ramped up to operational status at this stage.

Step 610 is substantially similar to what is described above with respect to FIG. 6.

At 720, electrical contact pads are provided to the first and second substrate films to corresponding positions with respect to each other. The corresponding position refers herein to a position in which the electrical contact pads are, for example, aligned so that when the substrate films are arranged for molding, the, optionally elastic, electrically conductive member (provided in step 130) extends from the electrical contact pad of the first substrate film to be in contact with the electrical contact pad of the second substrate film thus providing an electrical connection between the electrical contact pads on the first and second substrate films.

Step 130 is substantially similar to what is described above with respect to FIG. 1.

At step 730, forming such as thermoforming or cold forming takes place. During forming, the substrate films, preferably already provided with electronics, may be shaped to a desired substantially three-dimensional shape. The electronics shall have been disposed preferably so as to avoid locations of greatest stress occurring during forming, such as the locations of greatest pressure or curvature. Only one substrate may be formed, or both of the substrates may be formed identically or in different ways.

Step 630 is substantially similar to what is described above with respect to FIG. 6.

At 799, the method execution is ended. The three-dimensional electronic assembly manufactured may be taken out of the mold structure once the molded material has been solidified enough.

Figure 8:
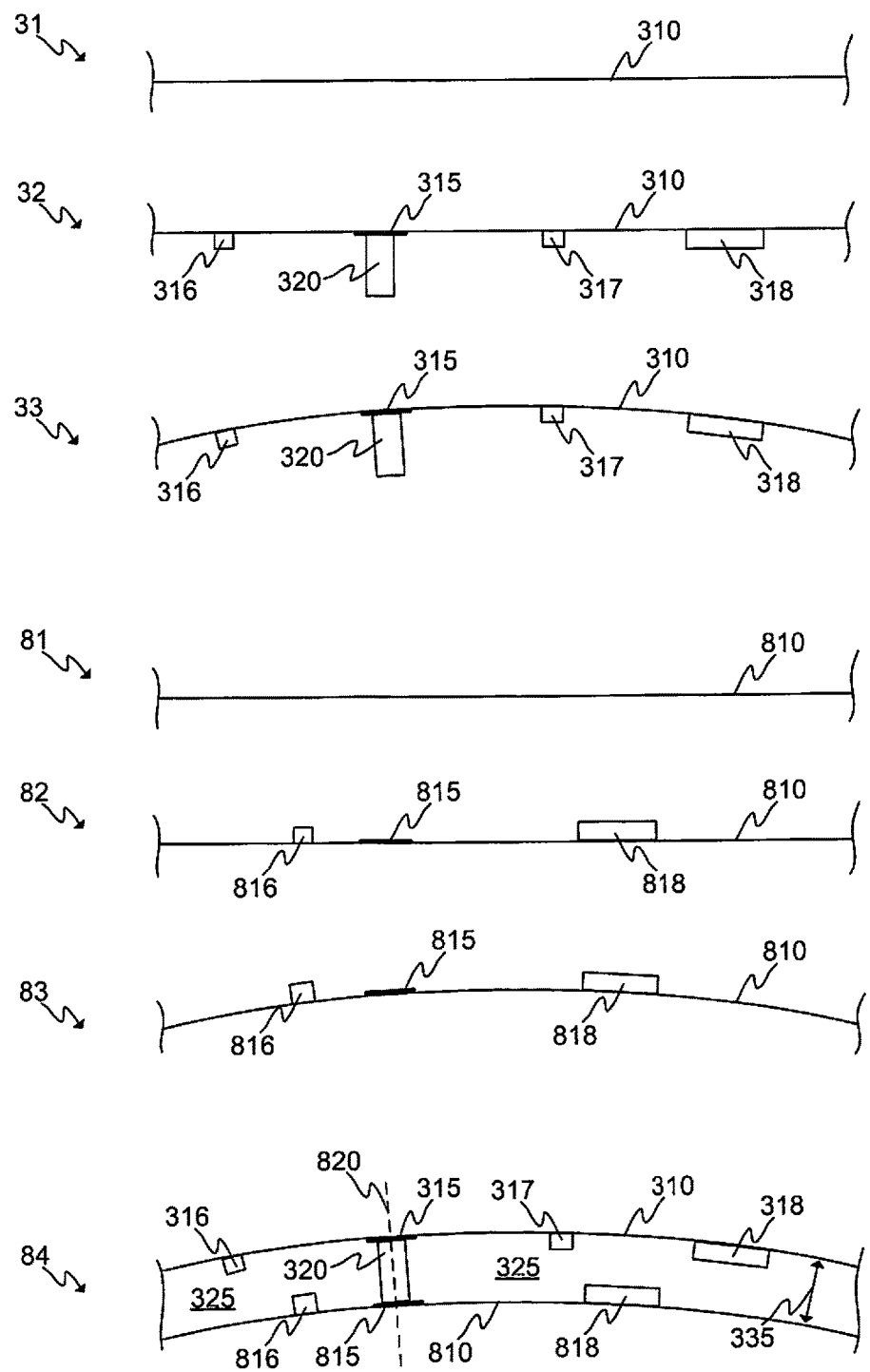
FIG. 8 illustrates an electronic assembly according to an embodiment of the present invention.

FIG. 8 illustrates an electronic assembly according to an embodiment of the present invention. At 31 and 81, substrate films 310, 810, preferably flexible substrate films, are obtained. There may be decorations, graphical indications, colors etc. produced onto the film by printing, for instance. Alternatively or additionally, other layers such as the protective layer could be provided with such features. For example, screen printing or inkjet printing may be applied. Decorative or indicative (e.g. instructive) features may be generally provided using IMD/IML compatible methods.

At 32 and 82, electrical contact pads 315 and 815 are provided in corresponding positions 820. Furthermore, electronics may also be provided on one surface of a substrate film. The electronics comprise at least an electronic contact pad 315, but may also comprise electronic components 316-318, 816, 818, such as passive components, conductors, LEDs, or ICs by feasible manufacturing or mounting technology. Mounting techniques may include surface mounting and through-hole mounting, for instance. Manufacturing such as printing may refer to screen printing or inkjet printing among various other options.

Furthermore, at 32, an, optionally elastic, electrically conductive member 320, such as an electrical conductor 320 or an electrically conductive spring connector 320 or an enclosed elastic electrically conductive member 520, is coupled to the electrical contact pad 315 provided to the substrate film 310. The, optionally elastic, electrically conductive member 320 may, advantageously, be coupled in such a way that one end of the member 320 is coupled to the provided electrical contact pad 315 and the member 320 then extends substantially perpendicularly from the substrate film 310. The, optionally elastic, electrically conductive member 320 may, however, extend in any position or direction with respect to the substrate film 310, mainly depending on the desired configuration and/or the electrical contact pad 315. The, optionally elastic, electrically conductive member 320 may be coupled prior to or substantially simultaneously or after other electronic components 316-318, which are to be arranged on the substrate 310.

At 33 and 83, the substrate films are formed such as by thermoforming or cold forming. During forming, the substrate films, preferably already provided with electronics, may be shaped to a desired substantially three-dimensional shape, either to identical or different shapes. In some embodiments, only one of the substrates may be formed. The, optionally elastic, electrically conductive member 320 and the electronics 316-318 shall have been disposed preferably so as to avoid locations of greatest stress occurring during forming, such as the locations of greatest pressure or curvature.

At 84, a material layer 325, preferably plastic layer, e.g. of thermoplastic, thermosetting, elastomeric material, polymer, organic, biomaterial, composite, such as organic or graphic, as well as any combination thereof, is molded between the substrate films between the electrical contact pads of which the, optionally elastic, electrically conductive member extends, thus embedding the, optionally elastic, electrically conductive member by utilizing a mold. Injection molding may be applied. The substrate and optionally the protective layer(s) (if already present) may be used as an insert in the mold. Optionally multi-shot or multi-component molding is applied to provide e.g. multiple materials to the structure. Plastic layer may be at least partially optically transparent and/or comprise recesses or through-holes to provide visual path to the underlying electronics that may include optoelectronic components (LEDs, photosensitive detectors) or e.g. a display such as OLED (organic LED) display. The plastic layer may additionally or alternatively contain opaque, e.g. colored or graphics-containing, or translucent portions. It may be further provided with surface relief forms or other features for various purposes, such as for optical use (e.g. light incoupling, outcoupling, scattering, or reflection).

Figure 9A:
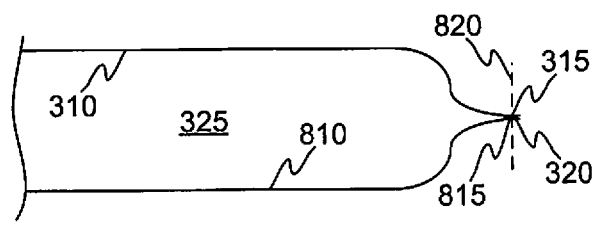
FIGS. 9A-9C illustrate electronic assemblies according to some embodiments of the present invention.
Figure 9B:
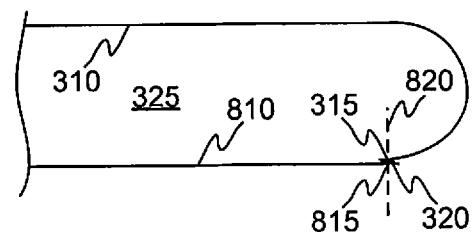
Figure 9C:
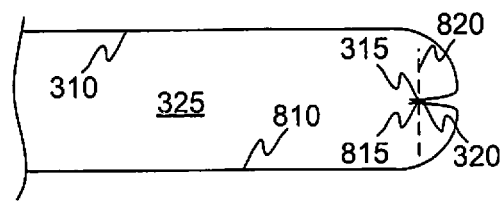

FIGS. 9A-9C illustrate some embodiments in accordance with the present invention. The, optionally elastic, electrically conductive member 320 may be utilized in connecting two substrate films 310, 810 to be in electrical connection with each other. There are multiple examples of how to provide the electrical substrate-to-substrate connection according to a plurality of embodiments of the present invention. FIG. 9A illustrate an example according to which said two substrates 310, 810, may be arranged to be close to each other such that the first 315 and the second 815 electrical pads reside at corresponding positions 820 with respect to each other and are essentially in contact with one another. In this case, the, optionally elastic, electrically conductive member 320 may a small piece or amount of conductive material arranged to properly establish the electrical connection between the two pads 315. The substrates are further pressed against each other due to molded material. The two substrates 310, 810 may essentially be arranged to be in direct connection with each other, for example, at the areas of the edge of the substrates, as shown in FIGS. 9A-9C. However, the electrical connection may also be arranged to reside at least on the center area of one of the substrates. In this case, the first electrical contact pad 315 may be coupled to the, optionally elastic, electrically conductive member 320 which may essentially reside on the second substrate film 810. The electrical coupling points, that is, the electrical pads 315, 815, may reside on the opposite surfaces of the substrates 310, 810.

According to embodiments of the present invention, such as shown in FIGS. 9B and 9C, the edge of at least one substrate, that is, one or both of them, may be folded or bent such as to arrange the electrical pads 315, 815 to be in the corresponding positions 820 with respect to each other. The electrical connection from one substrate to another may then be established by electrically conductive member 320. As can be seen in FIGS. 9A-9C, the electrical pads 315, 815 may reside on either one of the surfaces of the substrates.

A person skilled in the art shall know beforehand or determine by field testing the optimum process parameters in the light of used materials, dimensions and components. Few merely exemplary guidelines can be given for general guidance. When the substrate film is PET and the plastics to be overmolded thereon is PC, the temperature of the melted PC may be between 280 and 320 degrees Celsius and applicable mold temperature may range from about 20 to 95 degrees Celsius, i.e. it may be about 80 degrees Celsius, for example. The used substrate film and the process parameters shall be selected such that the substrate remains substantially solid during the process.

Potentially preinstalled electronics have been preferably attached to the substrate such that they remain static during the molding. Optionally, roll-to-roll technique may be utilized during the execution of the manufacturing method at least for selected phases, such as the provision of the substrate with traces/components or the integration of layers together. Application of roll to roll requires some flexibility from the used material layers. Accordingly, the end product (the obtained multilayer structure or even a device ultimately hosting it) may be flexible. However, the present invention is in practice applicable also to scenarios with more rigid material sheets or generally, pieces of desired material.

Forming, such as thermoforming or cold forming, may be implemented in various embodiments of the present invention by heating the substrate(s), with or without other electronic components, to the formed and/or the mold structure utilized for the forming. The pressure applied on the object in order it to be formed may be applied, for example, by a form press utilizing a mold structure having a suitable shape, or by using suitable negative or positive air pressure applied on the surface of the substrate(s) in order to form it to a suitable shape, preferably, such as by utilizing a cavity plate.

The target electronic product or device incorporating the electronic assembly may include e.g. a consumer electronics device, industrial electronics, automation equipment, machinery, automotive product, safety or protection device, computer, tablet, phablet, mobile terminal such as cell phone, alarming device, wearable electronics/product (garment, headwear, footwear, etc.), sensor device, measurement device, display device, game controller or console, lighting device, multimedia or audio player, audiovisual (AV) device, sports gear, communication device, transport or carrying equipment, battery, optical device, solar panel or solar energy device, transmitter, receiver, wirelessly controlled device, or controller device.

Features described in the preceding description may be used in combinations other than the combinations explicitly described. Although functions have been described with reference to certain features, those functions may be performable by other features whether described or not. Although features have been described with reference to certain embodiments, those features may also be present in other embodiments whether described or not.

The invention claimed is:

1. A method for manufacturing an electronic assembly, the method comprising:
   obtaining a first substrate film for accommodating electronics;
   printing a first electrical contact pad on the first substrate film;
   coupling an electrically conductive member to the first electrical contact pad; and
   molding, in a cavity defined by a mold structure, a second material layer onto the first substrate film to embed the electrically conductive member in the second material layer, wherein the electrically conductive member extends through the cavity during molding to be in contact with an element on an opposite side of the cavity with respect to the first electrical contact pad such that at least a part of the electrically conductive member is accessible after molding to provide an electrical connection to the first electrical contact pad through the second material layer.

2. The method according to claim 1, wherein the obtaining the first substrate film further comprises obtaining a second film, the second material layer molded at least between the first substrate film and the second film to embed the electrically conductive member, the electrically conductive member extending from the first electrical contact pad to be in contact with the second film, the electrically conductive member compressing against the second film.

3. The method according to claim 2, wherein the obtained second film is a second substrate film for accommodating electronics, and printing further comprises printing a second electrical contact pad on the second substrate film to a corresponding position with respect to the first electrical contact pad, molding comprises molding the electrically conductive member to extend from the first electrical contact pad to be in contact with the second electrical contact pad, the electrically conductive member compressed against the second electrical contact pad to provide an electrical connection from the first electrical contact pad to the second electrical contact pad through the second material layer.

4. The method according to claim 3, wherein the second electrical contact pad is arranged in the corresponding position so that the first and second electrical contact pads align opposite to each other when the first and second substrates films are being inserted into the mold for molding the second material layer.

5. The method according to claim 3, wherein printing further comprises providing at least one electronics component onto at least one of the first and second substrate films such that the at least one electronics component, the first electrical contact pad, the second electrical contact pad, and the electrically conductive member form an electrical circuit residing on both of the first and second substrate films.

6. The method according to claim 1, wherein the electrically conductive member is an electrically conductive spring connector.

7. The method according to claim 6, wherein the electrically conductive spring connector is arranged to compress against the element such that at least the part of the electrically conductive spring connector is accessible after molding to provide the electrical connection to the first electrical contact pad through the second material layer.

8. The method according to claim 6, wherein the electrically conductive spring connector is enclosed to sustain elasticity of the electrically conductive spring connector during molding.

9. The method according to claim 3, wherein at least one of the first and second substrate films is a flexible substrate film.

10. The method according to claim 1, wherein molding the second material layer includes injection molding the second material layer onto the first substrate film.

11. The method according to claim 1, wherein the element is at least one of a part of the mold structure, a film, a spacer, or a conductor.

12. The method according to claim 9, further comprising thermoforming at least one of the first or second substrate films to a desired three-dimensional shape.

13. The method according to claim 9, further comprising cold forming at least one of the first or second substrate films to a desired three-dimensional shape.

14. A method for manufacturing an electronic assembly, the method comprising:
   obtaining a first substrate film for accommodating electronics;
   printing a first electrical contact pad on the first substrate film;
   coupling an electrically spring connector to the first electrical contact pad; and
   molding, in a cavity defined by a mold structure, a second material layer onto the first substrate film to embed the electrically conductive spring connector, wherein the electrically conductive spring connector extends through the cavity during molding to be in contact with an element on an opposite side of the cavity with respect to the first electrical contact pad such that at least a part of the electrically conductive spring connector is accessible after molding to provide an electrical connection to the first electrical contact pad through the second material layer.

15. The method according to claim 14, wherein the electrically conductive spring connector is arranged to compress against the element such that at least the part of the electrically conductive spring connector is accessible after molding to provide the electrical connection to the first electrical contact pad through the second material layer.

16. The method according to claim 15, wherein the electrically conductive spring connector is enclosed to sustain elasticity of the electrically conductive spring connector during molding.

17. The method according to claim 14, wherein molding the second material layer includes injection molding the second material layer onto the first substrate film.

18. A method for manufacturing an electronic assembly, the method comprising:
   obtaining first and second substrate films for accommodating electronics;
   printing a first electrical contact pad on the first substrate film;
   printing a second electrical contact pad on the second substrate film to a corresponding position with respect to the first electrical contact pad;
   coupling an electrically conductive member to the first electrical contact pad;
   molding, in a cavity defined by a mold structure, a second material layer between the first substrate film and the second substrate film to embed the electrically conductive member, wherein, during molding, the electrically conductive member extends from the first electrical contact pad through the cavity to be in contact with the second electrical contact pad such that at least a part of the electrically conductive member is accessible after molding to provide an electrical connection to the first electrical contact pad through the second material layer, the electrically conductive member being compressed against the second electrical contact pad to provide an electrical connection from the first electrical contact pad to the second electrical contact pad through the second material layer; and thermoforming or cold forming at least one of the first or second substrate films to a desired three-dimensional shape, wherein at least one of the first or second substrate films is a flexible substrate film.

19. The method according to claim 18, wherein the second electrical contact pad is arranged in the corresponding position so that the first and second electrical contact pads align opposite to each other when the first and second substrates films are being inserted into the mold for molding the second material layer.

20. The method according to claim 18, wherein printing further comprises providing at least one electronics component onto at least one of the first or second substrate films such that the at least one electronics component, the first electrical contact pad, the second electrical contact pad, and the electrically conductive member form an electrical circuit residing on both of the first and second substrate films.

* * * * *